(12) United States Patent
Leon et al.

(10) Patent No.: US 7,031,158 B2
(45) Date of Patent: Apr. 18, 2006

(54) HEAT PIPE COOLED ELECTRONICS ENCLOSURE

(75) Inventors: Eduardo Leon, Lisle, IL (US); Walter Harwood, Streamwood, IL (US); William Bond, Cary, IL (US); Frank Hernandez, Schaumburg, IL (US); Avinash K. Vaidya, Riverwoods, IL (US)

(73) Assignee: Charles Industries, Ltd., Rolling Meadows, IL (US)

( * ) Notice: Subject to any disclaimer, the term of this patent is extended or adjusted under 35 U.S.C. 154(b) by 312 days.

(21) Appl. No.: 10/695,712

(22) Filed: Oct. 29, 2003

(65) Prior Publication Data
US 2004/0085733 A1    May 6, 2004

Related U.S. Application Data

(60) Provisional application No. 60/422,240, filed on Oct. 30, 2002.

(51) Int. Cl.
*H05K 7/20*    (2006.01)
(52) U.S. Cl. ............. 361/700; 165/104.33; 174/15.1; 361/690; 361/703
(58) Field of Classification Search ........... 165/104.33, 165/80.3; 174/15.1; 361/690, 700, 703, 361/715
See application file for complete search history.

(56) References Cited

U.S. PATENT DOCUMENTS

| 4,449,576 A | 5/1984 | Baum et al. |
|---|---|---|
| 4,465,899 A | 8/1984 | Mauclere et al. |
| 4,679,250 A | 7/1987 | Davis et al. |
| 5,329,425 A | 7/1994 | Leyssens et al. |
| 5,343,358 A | 8/1994 | Hilbrink |
| 5,777,846 A | 7/1998 | Hayes et al. |
| 5,842,514 A | 12/1998 | Zapach et al. |
| 5,844,777 A | 12/1998 | Gates |
| 5,896,268 A | 4/1999 | Beavers |
| 5,949,650 A | 9/1999 | Bulante et al. |
| 6,055,157 A | 4/2000 | Bartilson |
| 6,104,611 A | 8/2000 | Glover et al. |
| 6,118,662 A | 9/2000 | Hutchison et al. |
| 6,169,247 B1 * | 1/2001 | Craft et al. ................ 174/15.1 |
| 6,292,556 B1 | 9/2001 | Laetsch |
| 6,310,772 B1 | 10/2001 | Hutchison et al. |
| 6,404,637 B1 * | 6/2002 | Hutchison et al. .......... 361/704 |
| 6,628,521 B1 | 9/2003 | Gustine et al. |

* cited by examiner

*Primary Examiner*—Gregory Thompson
(74) *Attorney, Agent, or Firm*—Leydig, Voit & Mayer Ltd

(57) ABSTRACT

An enclosure for electronic components is provided. The enclosure includes an electronics housing that has at least one slot for receiving one or more electronic components. The slot is defined by a plurality of walls. A heat pipe thermal management system is associated with the slot. The heat pipe system includes a heat pipe having a first portion embedded into one of the walls defining the slot for conducting heat from the wall to a second portion of the heat pipe extending out of the electronics housing. At least one cooling fin is carried by the second portion of the heat pipe such that heat from the heat pipe is conducted into the fin and the fin dissipates the heat to the ambient atmosphere outside of the electronics housing.

16 Claims, 6 Drawing Sheets

HEAT PIPE COOLED ELECTRONICS ENCLOSURE

FIELD OF THE INVENTION

This invention pertains generally to enclosures for electronic equipment, and more particularly to controlling heat build-up in electronic enclosures.

BACKGROUND OF THE INVENTION

As electronic components have become faster and more powerful, thermal management has become a critical issue. Specifically, all electronic components produce heat when operating. To ensure that the electronic components achieve optimal performance and dependability, this heat must be dissipated. Thus, in applications involving the use of these faster and more powerful electronic components, measures have to be taken to remove the excess heat that is produced.

One application in which faster and more powerful electronics have made thermal management a critical design issue is repeater enclosures for digital telecommunications systems. In a digital telecommunications system, repeaters are used to repeat digital signals in order to overcome signal degradation when an end user is located a long distance from the service provider. A repeater enclosure typically houses a plurality of repeater cards that include electronics that produce heat. Moreover, repeater enclosures are frequently located outdoors where they can be subject to extreme solar loads.

Older repeater enclosures frequently did not have any mechanism for controlling heat because the electronics did not generate large amounts of heat. More recently, repeater enclosures have included aluminum heat sinks surrounding the electronics for removing the excess heat. However, because the heat given off by the electronics must travel through the air to the heat sink and then to the outer housing, the heat sinks have a high thermal resistance and thus remove heat very inefficiently. Moreover, the heat sinks make the enclosures very large and heavy. An active cooling system such as fans is generally not an option on equipment such as repeater enclosures because the enclosure is not connected to an electricity source.

The thermal dissipation limitations of existing repeater enclosures are a particular problem with telecommunication systems designed to handle higher-capacity and higher-speed data transmission such as HDSL4 type systems. These systems require the use of more powerful repeater cards, which, in turn, generate more heat. Because conventional repeater enclosures remove heat very inefficiently, only a limited number of these more powerful repeater cards can be stored in a conventional enclosure before the heat in the enclosure reaches an unacceptable level, particularly in locations where heavy solar loading is an issue.

BRIEF SUMMARY OF THE INVENTION

The invention provides an enclosure for electronic components. The enclosure includes an electronics housing that has at least one slot for receiving one or more electronic components such as repeater cards for telecommunications systems. The slot in the electronics housing is defined by a plurality of walls. To dissipate heat in the electronics housing produced by operation of the electronic components, a heat pipe thermal management system is associated with the slot. The heat pipe system includes a heat pipe having a first portion embedded into one of the walls defining the slot for conducting heat from the wall to a second portion of the heat pipe extending out of the electronics housing. At least one cooling fin is carried by the second portion of the heat pipe such that heat from the heat pipe is conducted into the fin and the fin dissipates the heat to the ambient atmosphere outside of the electronics housing.

DETAILED DESCRIPTION OF THE INVENTION

Figure 1:
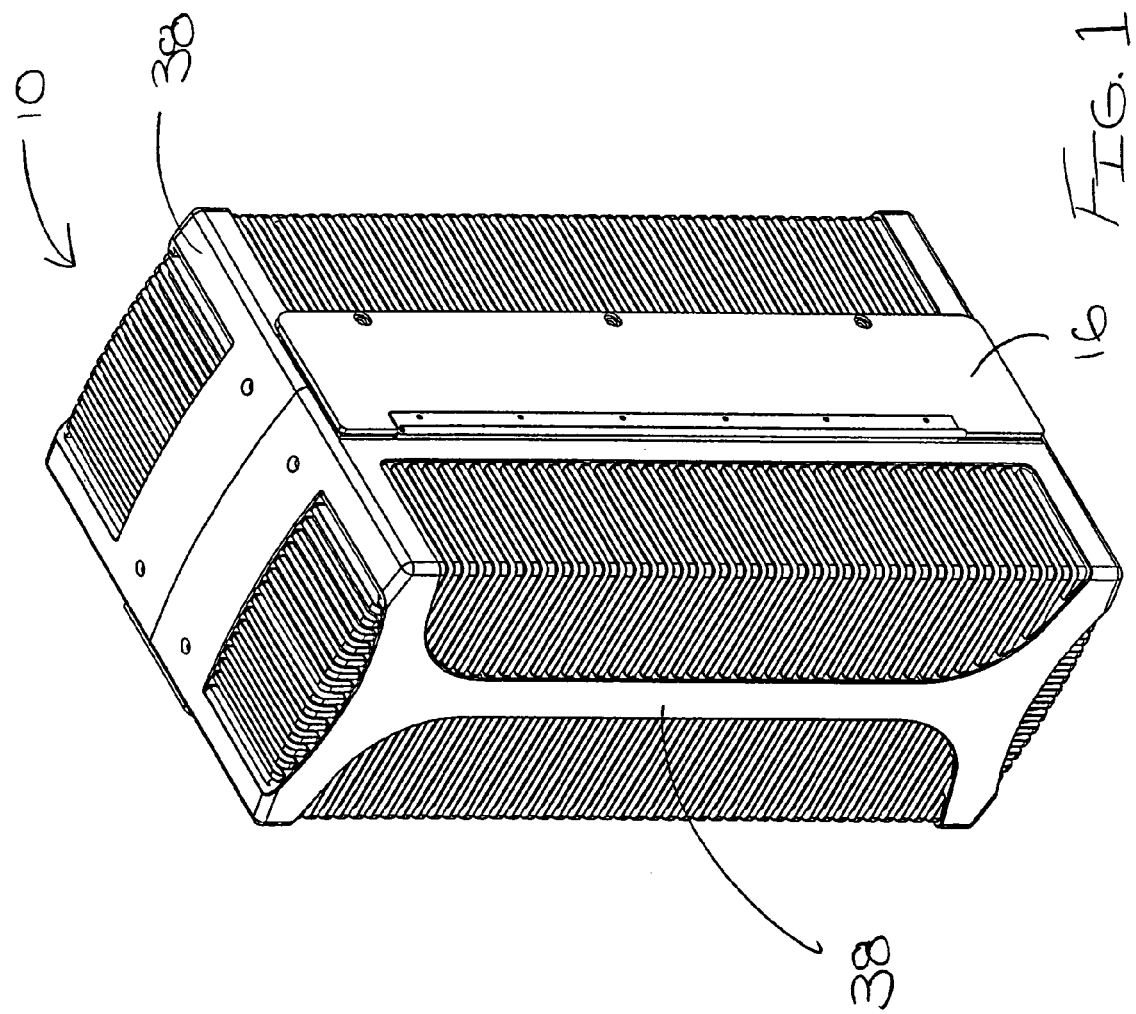
FIG. 1 is a perspective view of an exemplary telecommunications enclosure constructed in accordance with the teachings of the present invention.
Figure 2:
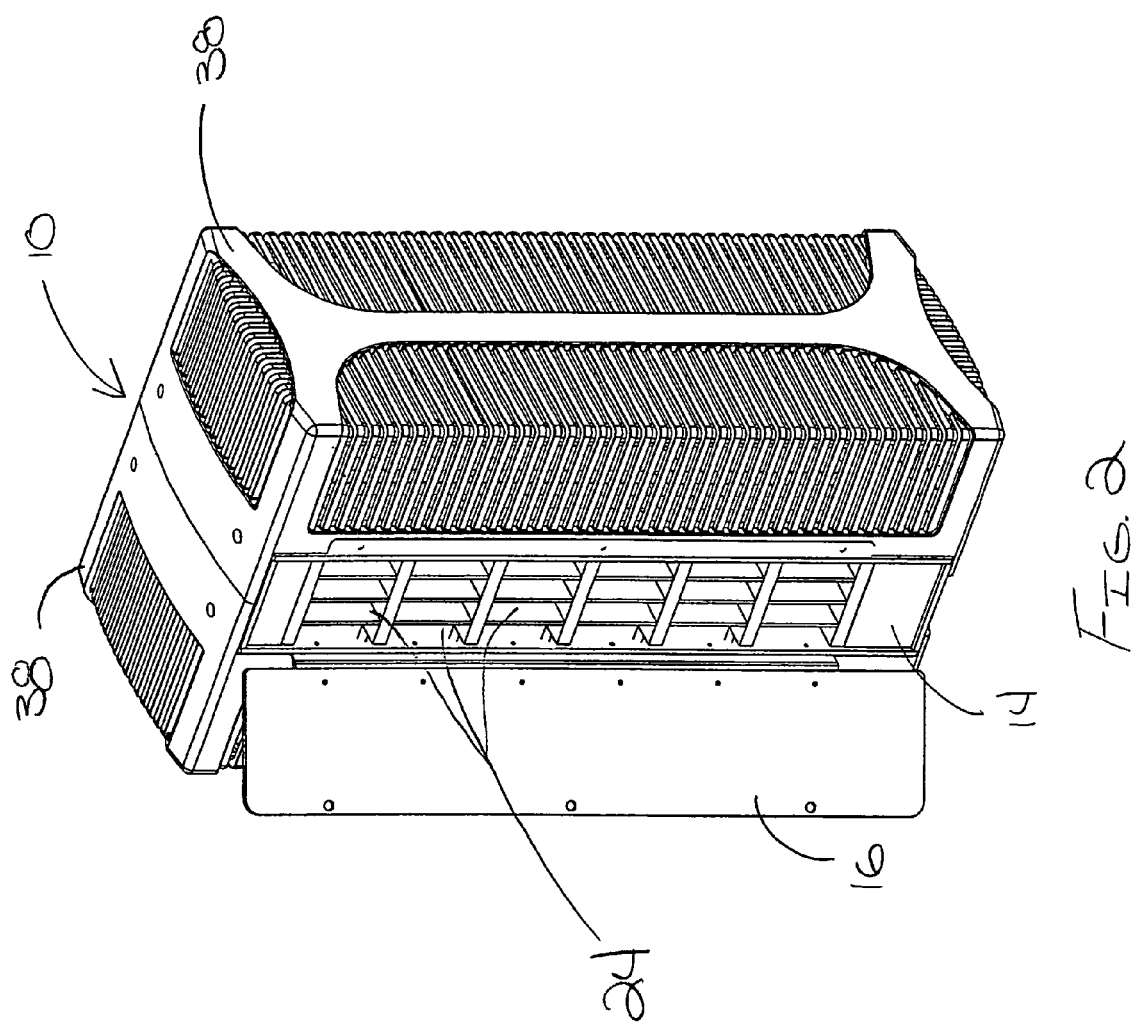
FIG. 2 is a perspective view of the telecommunications enclosure of FIG. 1 with the door in an open position.

Referring now to FIGS. 1 and 2 of the drawings, there is shown an illustrative embodiment of an electronics enclosure, in this case a repeater enclosure 10, constructed in accordance with the teachings of the present invention. The repeater enclosure 10 is configured to receive, in this case, a plurality of repeater cards that are housed within card connectors 12 (see FIG. 4). Each repeater card generally consists of one or more printed circuit boards that support a number of powered electronic components. These electronic components produce heat when in operation. While the present invention is described in connection with a repeater enclosure for a telecommunications system, those skilled in the art will appreciate that the teachings of the present invention are equally applicable to other types of electronics enclosures.

Figure 3:
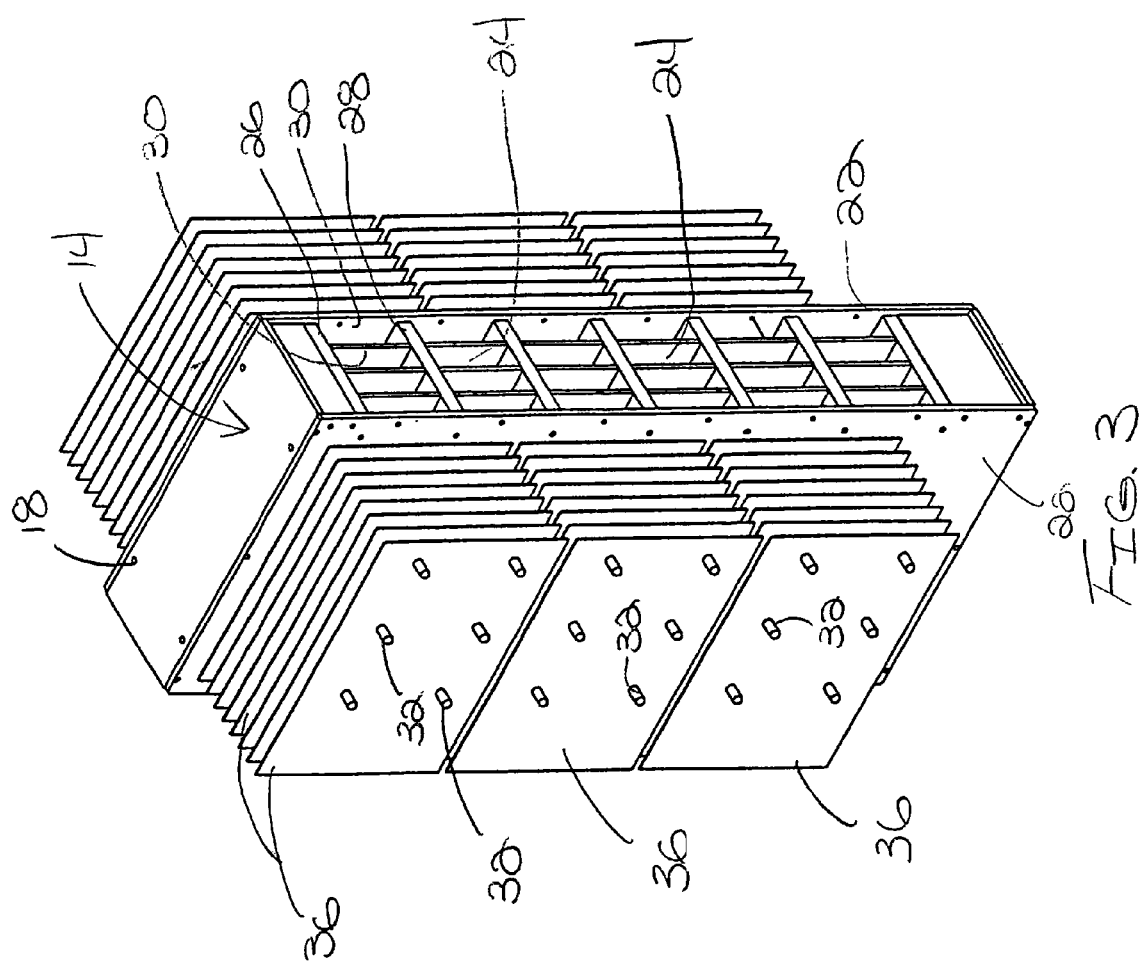
FIG. 3 is a perspective view of the electronic card housing and heat pipe thermal management system of the telecommunications enclosure of FIG. 1.
Figure 6:
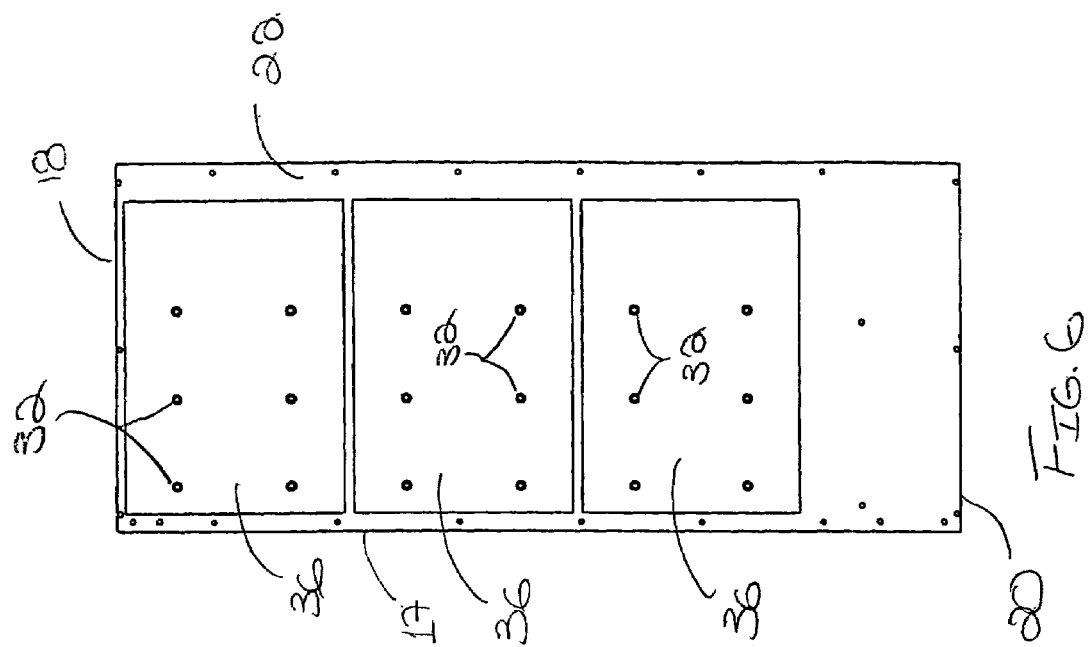
FIG. 6 is a side elevation view of the electronic card housing and heat pipe thermal management system of the telecommunications enclosure of FIG. 1.
Figure 4:
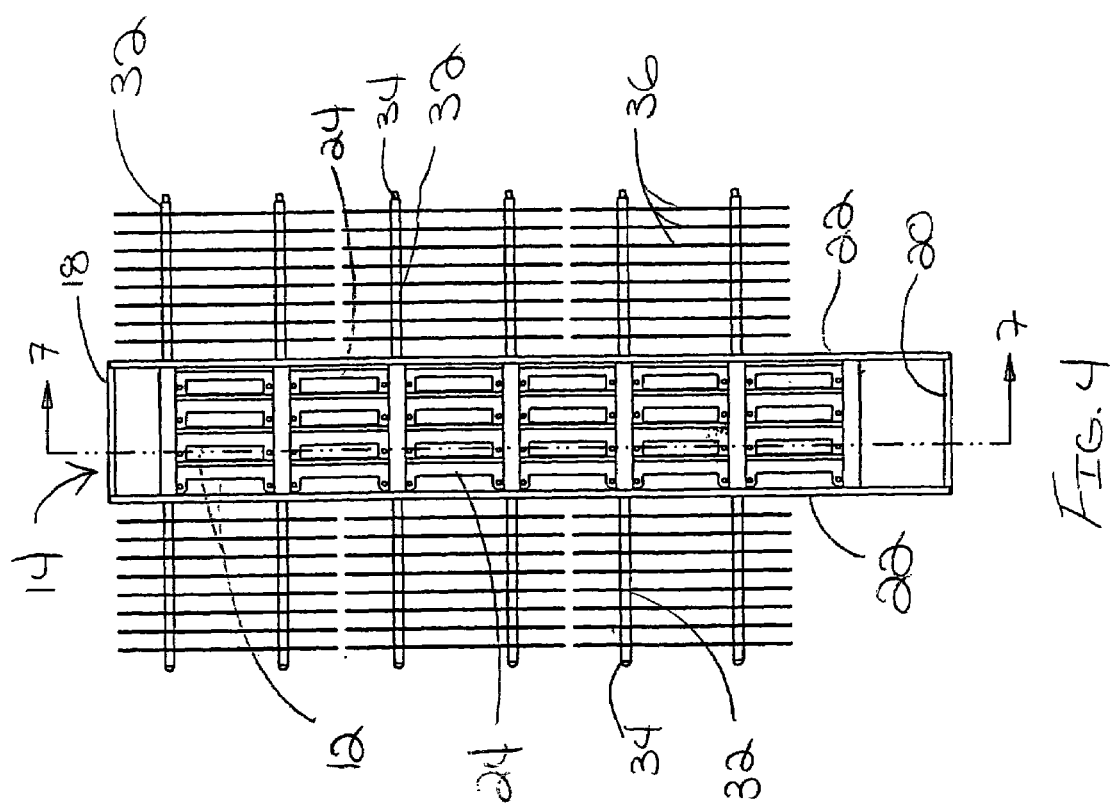
FIG. 4 is a front elevation view of the electronic card housing and heat pipe thermal management system of the telecommunications enclosure of FIG. 1.
Figure 5:
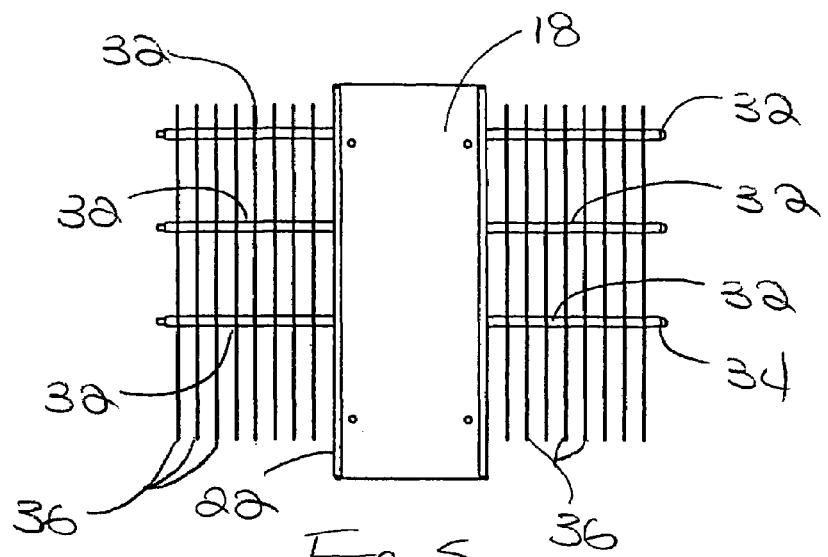
FIG. 5 is top plan view of the electronic card housing and heat pipe thermal management system of the telecommunications enclosure of FIG. 1.

For receiving repeater cards 12, the enclosure 10 includes a card housing 14 that protects the cards 12 from exposure to sunlight and the environment. In this instance, the card housing 14 is located in the center of the enclosure 10 and is accessible via front and rear doors 16, 17 (see, e.g., FIG. 2) that allows for insertion, removal and inspection of the cards 12. The card housing is defined by upper and lower walls 18, 20, and a pair of opposing sidewalls 22 as shown in FIGS. 3, 4 and 6. In the illustrated embodiment, the interior of the card housing 14 is divided by vertical and horizontal partitions into a plurality of slots 24. Each slot 24 has an upper wall 26, lower wall 28, rear wall 29 and a pair of opposing sidewalls 30 (shown with reference to the upper right slot in FIG. 3). The housing walls and partitions can be constructed of any suitable heat conductive material, such as aluminum. In the case of the illustrated embodiment, the card housing 14 is divided into a four-by-six array of twenty-four slots 24 each of which is sized to receive a single repeater card. However, those skilled in the art will appreciate that the teachings of the present invention are applicable to any housing having one or more slots for receiving electronic components.

Figure 7:
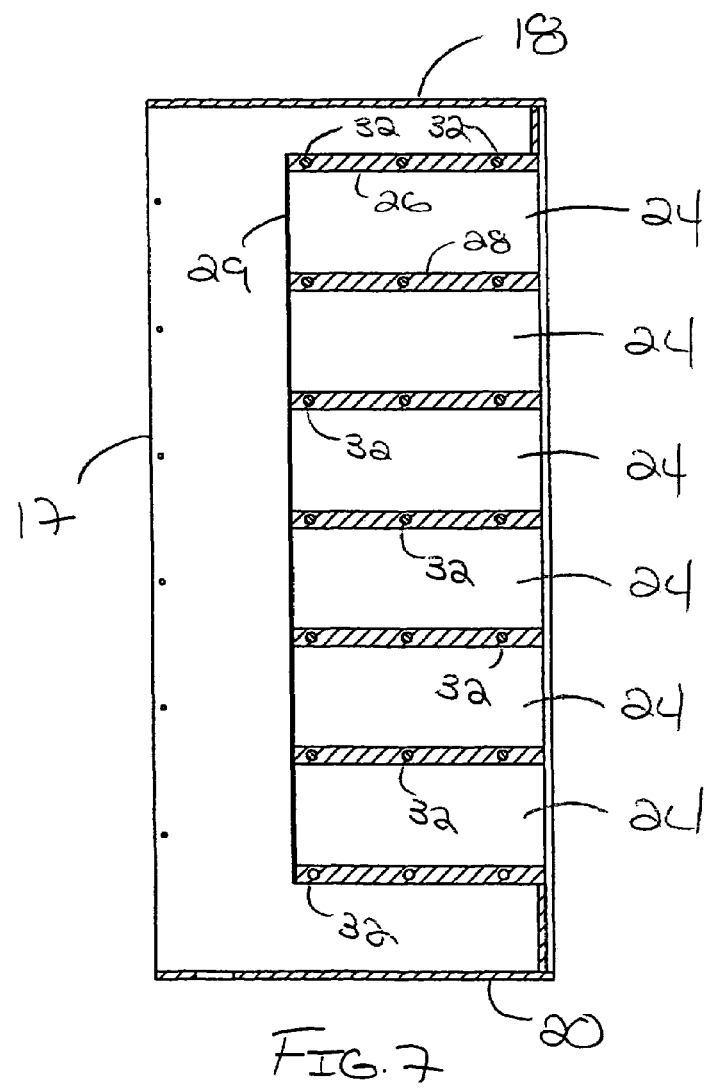
FIG. 7 is a cross-sectional view of the electronic card housing and heat pipe thermal management system taken along the line 7—7 in FIG. 4.

To dissipate heat build-up in the card housing 14 generated by electronic components associated with the repeater cards 12, the repeater enclosure 10 includes a unique thermal management system incorporating heat pipes 32 embedded in at least one of the walls 26, 28, 29, 30 of each slot 24 (see, e.g. FIGS. 3, 4 and 7). Heat pipes are passive heat transfer devices having a high effective thermal conductivity, the construction and operation of which are well known. Completely embedding the heat pipes 32 in the walls of the slots 24 leads to more efficient and effective heat transfer. For example, as compared to attaching the heat pipes to an outer surface of the walls, embedding the heat pipes in the walls maximizes the surface area of the heat pipe that is available to receive heat. In particular, when a heat pipe is attached to an outer surface of a wall, heat is conducted into the heat pipe primarily through the limited area of the pipe which is in direct contact with the wall surface. Since the majority of the heat pipe does not contact the wall surface, the effectiveness of the heat transfer into the heat pipe is limited. When the heat pipes are embedded in the walls, the pipes are completely surrounded by the wall substantially increasing the surface area of the heat pipe through which heat can be conducted from the wall.

As shown in FIGS. 4 and 7, the illustrated repeater enclosure 10 has three laterally extending heat pipes 32 embedded in each of the horizontal partitions that form the upper and lower walls 26, 28 of the slots 24. Thus, the upper and lower walls 26, 28 of each slot 24 have a portion of three different heat pipes 32 embedded therein. It will be appreciated that any number of heat pipes 32 can be embedded in the walls of the card housing 14 depending on the amount of heat transfer desired. This arrangement with each slot 24 having at least one heat pipe 32 embedded in a wall thereof helps thermally isolate the individual slots as compared to a more open design. Additionally, the embedding of the heat pipes 32 in the walls of the card housing 14 saves a significant amount of space allowing the enclosure to have a much more compact design than if externally mounted heat pipes were used.

Each of the heat pipes 32 is oriented so as to transfer heat out of the interior of the card housing 14 to the ambient atmosphere outside the card housing. To this end, each heat pipe 32 has a first portion inside the wall 26, 28 and a second portion 34 which extends out of the card housing 14. In this case, the heat pipes 32 have portions extending out of both sides of the card housing 14 where their free ends are exposed to the cooler ambient air as best shown in FIGS. 3 and 4. Alternatively, as opposed to extending from one side through the wall and out the opposing side, the heat pipes could be arranged with one end portion embedded inside the wall 26, 28 and an opposing second end portion extending out of the card housing 14. With such a heat pipe arrangement, alternate heat pipes could be arranged to extend out opposite sides of the card housing in order to balance the enclosure.

To facilitate dissipation of heat from the heat pipes 32 to the ambient air, cooling fins 36 can be provided on the portion of each heat pipe 32 that extends out of the card housing 14. In this case, each heat pipe 32 has a plurality of fins 36 attached thereto. The illustrated fins 36 generally consist of vertically extending plates each of which is connected to a plurality of the heat pipes 32. The number, size and arrangement of the fins 36 will depend on the desired amount of heat transfer. Accordingly, the present invention is not limited to any particular fin configuration or arrangement.

As shown in FIGS. 1 and 2, a protective cover 38 can be arranged over the set of fins 36 on each side of the card housing 14 to protect the fins from damage. The protective covers 38 can be mounted to the card housing 14 and are ventilated with a plurality of airflow apertures to permit airflow to the fins 36. The result is a compact, aesthetically-pleasing design with the card housing 14 being flanked by the two banks of fins.

In operation, the heat produced by the electronic components on the repeater card 12 mounted in a particular slot 24 is transferred essentially via convection into the upper and lower walls 26, 28 of the slot 24. The heat in the upper and lower walls 26, 28 is, in turn, conducted into the heat pipes 32, which draw the heat out of the card housing 14. Specifically, the heat pipes 32 are designed to pull the heat from the walls of the card housing 14 and then transfer the heat to the ends of the heat pipes 32 exposed outside the card housing. There, the heat is either transferred via convection to the ambient atmosphere directly from the individual heat pipes 32 or conducted into the fins 36. The fins 36 then dissipate the heat to the ambient atmosphere via convection.

Figure 8:
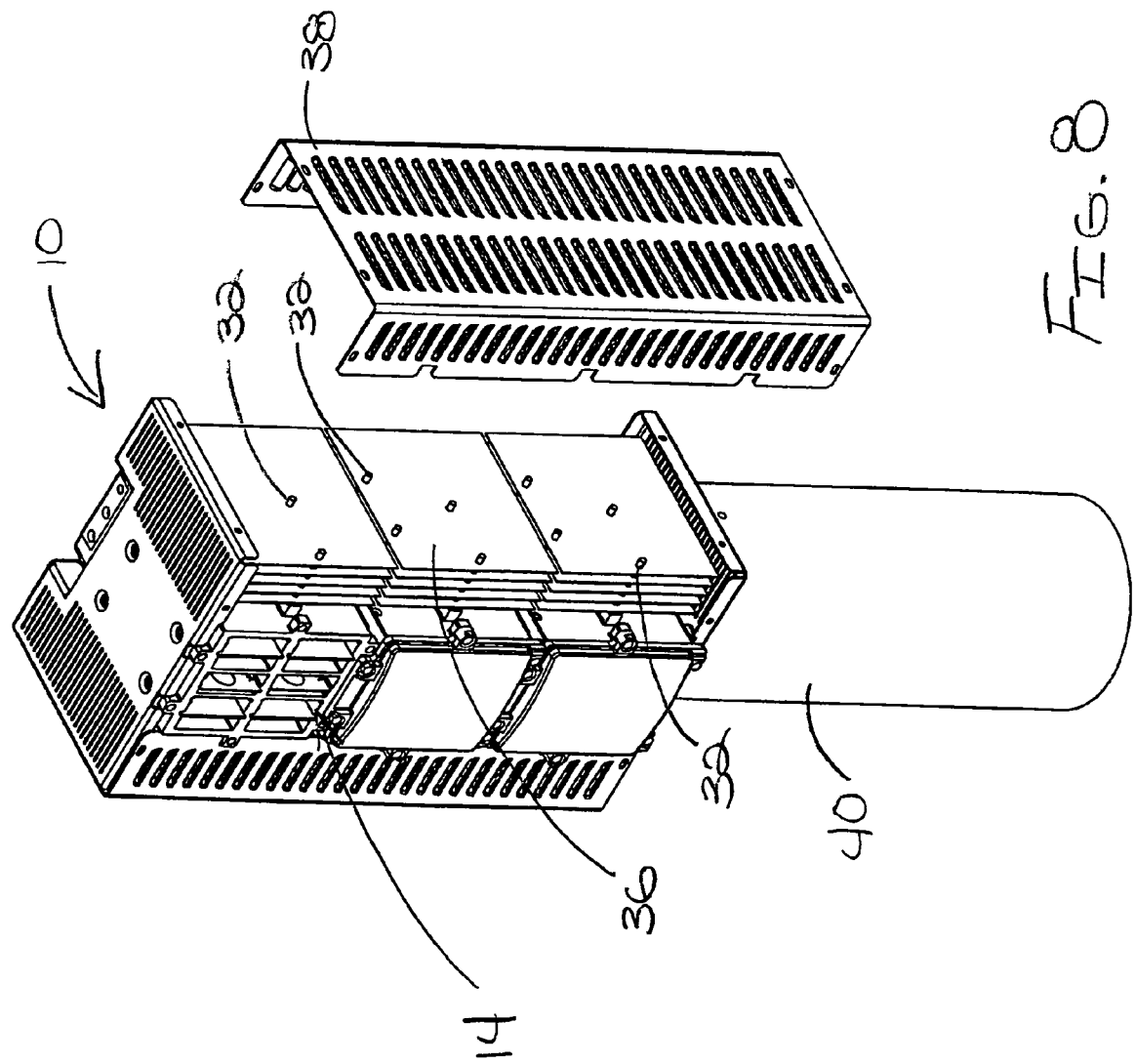
FIG. 8 is a perspective view of an exemplary telecommunications enclosure according to the invention mounted on a pedestal.

The repeater enclosure 10 can be arranged in any number of different environments or applications. For example, a repeater enclosure 10 according to the invention is shown mounted on a conventional pedestal 40 in FIG. 8. The repeater enclosure 10 of FIG. 8 has a slightly different configuration than that shown in FIGS. 1–7, such as for example with respect to the configuration of the card housing 14 and number and arrangement of the heat pipes 32. However, the embodiment of FIG. 8 incorporates the same unique thermal management system incorporating heat pipes 32 that are embedded into at least one of the walls of each of the repeater card slots 24.

From the foregoing it can be seen that the embedded heat pipes remove the internal heat in the card housing generated by the card electronics to the ambient atmosphere much more efficiently than existing electronic enclosures. As a result, the internal temperature in the card housing is substantially lower than with existing designs. This allows more cards to be stored in a given enclosure even under the most extreme solar loads without exceeding the safe operating temperature of the cards.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. An enclosure for electronic components comprising:
   an electronics housing including at least one slot for receiving one or more electronic components, the slot being defined by a plurality of walls; and
   a heat pipe system associated with the slot for dissipating heat produced by the one or more electronic components housed therein, the heat pipe system including:
      a heat pipe having a first portion embedded into one of the walls defining the slot for conducting heat from the wall to a second portion of the heat pipe extending out of the electronics housing; and
      at least one cooling fin carried by the second portion of the heat pipe such that heat from the heat pipe is conducted into the fin and the fin dissipates the heat to the ambient atmosphere outside of the electronics housing.

2. The electronics enclosure according to claim 1 wherein the electronics housing includes a plurality of slots.

3. The electronics enclosure according to claim 2 wherein each slot has an associated heat pipe system.

4. The electronics enclosure according to claim 1 wherein the heat pipe system includes a plurality of heat pipes each having a first portion embedded into one of the walls defining the slot for conducting heat from the wall to a second portion extending out of the electronics housing.

5. The electronics enclosure according to claim 1 wherein a plurality of cooling fins are carried by the second portion of the heat pipe.

6. The electronics enclosure according to claim 1 wherein the at least one cooling fin is surrounded by a protective cover that is ventilated.

7. The electronics enclosure according to claim 1 wherein the electronics housing includes a door that is movable into an open position for accessing the slot.

8. An enclosure for electronic components comprising:
   an electronics housing including a plurality of slots each of which is configured to receive one or more electronic components, each of the slots being defined by a plurality of slot walls; and
   a respective heat pipe system associated with each slot for dissipating heat produced by the one or more electronic components housed therein, each of the heat pipe systems including:
      a plurality of heat pipes each having a first portion embedded into one of the slot walls for conducting heat from the wall to a second portion of the heat pipe extending out of the electronics housing; and
      the second portion of each heat pipe being connected to a cooling fin such that heat from the heat pipe is conducted into the fin and the fin dissipates the heat to the ambient atmosphere outside of the electronics housing.

9. The electronics enclosure according to claim 8 wherein a plurality of fins are connected to the second portion of each of the heat pipes.

10. The electronics enclosure according to claim 9 wherein the fins are surrounded by a protective cover which is ventilated.

11. The electronics enclosure according to claim 9 wherein each fin is a connected to at least two of the plurality of heat pipes.

12. The electronics enclosure according to claim 8 wherein heat pipes extend out of opposing sides of the electronics housing.

13. The electronics enclosure according to claim 8 wherein the electronics housing includes a door that is movable into an open position for accessing the slots.

14. A repeater enclosure for a plurality of repeater cards comprising:
   a card housing including a plurality of slots each of which is configured to receive one or more repeater cards, each of the slots being defined by a plurality of slot walls;
   a respective heat pipe system associated with each slot for dissipating heat produced by the one or more repeater cards housed therein, each of the heat pipe systems including:
      a plurality of heat pipes each having a first portion embedded into one of the slot walls for conducting heat from the wall to a second portion of the heat pipe extending out of the electronics housing; and
      the second portion of each heat pipe being connected to a plurality of cooling fin such that heat from the heat pipe is conducted into the fin and the fin dissipates the heat to the ambient atmosphere outside of the electronics housing; and
   a protective cover surrounding the plurality of cooling fins, the protective cover being ventilated to permit the flow of ambient air therethrough.

15. The repeater enclosure of claim 14 wherein each fin is connected to at least two of the plurality of heat pipes.

16. The repeater enclosure according to claim 14 wherein the card housing includes a door that is movable into an open position for accessing the slots.

* * * * *